US008309658B2

(12) United States Patent
Katogi et al.

(10) Patent No.: US 8,309,658 B2
(45) Date of Patent: *Nov. 13, 2012

(54) ADHESIVE COMPOSITION, CIRCUIT CONNECTING MATERIAL, CONNECTING STRUCTURE FOR CIRCUIT MEMBER, AND SEMICONDUCTOR DEVICE

(75) Inventors: Shigeki Katogi, Tsukuba (JP); Houko Sutou, Hitachi (JP); Hiroyuki Izawa, Tsukuba (JP); Toshiaki Shirasaka, Tsukuba (JP); Masami Yusa, Tsukuba (JP); Takanobu Kobayashi, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/299,079

(22) Filed: Nov. 17, 2011

(65) Prior Publication Data

US 2012/0063109 A1 Mar. 15, 2012

Related U.S. Application Data

(63) Continuation of application No. 11/629,068, filed as application No. PCT/JP2005/010497 on Jun. 8, 2005, now Pat. No. 8,138,268.

(30) Foreign Application Priority Data

Jun. 9, 2004 (JP) .............................. P2004-171721
Aug. 11, 2004 (JP) .............................. P2004-234374

(51) Int. Cl.
*C08F 8/00* (2006.01)
(52) U.S. Cl. ....................................... 525/192; 525/194
(58) Field of Classification Search .................. 525/192, 525/194
See application file for complete search history.

(56) References Cited

U.S. PATENT DOCUMENTS 8,138,268 B2 * 3/2012 Katogi et al. ................. 525/192

FOREIGN PATENT DOCUMENTS

| CN | 1228424 | 9/1999 |
|---|---|---|
| CN | 1350045 | 5/2002 |
| CN | 1362459 | 8/2002 |
| EP | 1754762 | 2/2007 |
| JP | 1-113480 | 5/1989 |
| JP | 4-209663 | 7/1992 |
| JP | 7-70518 | 3/1995 |
| JP | 10-231456 | 9/1998 |
| JP | 11-035647 | 2/1999 |
| JP | 11-171951 | 6/1999 |
| JP | 11-322714 | 11/1999 |
| JP | 2001-115126 | 4/2001 |
| JP | 2001-294557 | 10/2001 |
| JP | 2002-97442 | 4/2002 |
| JP | 2002-114949 | 4/2002 |
| JP | 2002-203427 | 7/2002 |
| JP | 2003-507525 | 2/2003 |
| JP | 2003-64344 | 3/2003 |
| JP | 2003-160771 | 6/2003 |
| JP | 2003-221557 | 8/2003 |
| JP | 2003-257247 | 9/2003 |
| JP | 2004-35729 | 2/2004 |
| JP | 2010007083 | 1/2010 |
| JP | 4466650 | 3/2010 |
| JP | 4535202 | 6/2010 |
| KR | 2001-0050058 | 6/2001 |
| WO | WO 0112750 | 2/2001 |
| WO | WO 2005/121266 | 12/2005 |

OTHER PUBLICATIONS

Translation of the International Preliminary Report on Patentability, for Application No. PCT/JP2005/010497, mailed Dec. 28, 2006.
Official Action issued on Jun. 5, 2009, for CN Application No. 2005800180713.
Supplementary European Search Report dated Jun. 22, 2009, for EP Application No. 05748959.3.
Japanese Official Action issued Nov. 4, 2009, for JP Application No. 2009-212169.
Japanese Official Action issued Nov. 10, 2009, for JP Application No. 2009-212171.
"Hindered amine light stabilizers, HALS", *Handbook of Chemicals Containing Rubber or Plastic*, Rubber Digest Corp., 2nd Revised Edition, Oct. 30, 1993, pp. 132-137.
Korean Official Action issued Sep. 2, 2010, for Application No. 10-2009-7022863.
Japanese Official Action issued Feb. 15, 2011, for JP Application No. 2009-212258.
Japanese Official Action issued Nov. 8, 2011, for JP Application No. 2009-212258.

* cited by examiner

*Primary Examiner* — Nathan M Nutter
(74) *Attorney, Agent, or Firm* — Antonelli, Terry, Stout & Kraus, LLP.

(57) ABSTRACT

The adhesive composition of the invention comprises a thermoplastic resin, a radical polymerizing compound, a radical polymerization initiator and a radical polymerization regulator. According to the present invention it is possible to provide an adhesive composition, a circuit connecting material, a connection structure for a circuit member and a semiconductor device whereby curing treatment can be carried out with sufficient speed at low temperature, curing treatment can be carried out with a wide process margin, and adequately stable adhesive strength can be obtained.

10 Claims, 2 Drawing Sheets

ADHESIVE COMPOSITION, CIRCUIT CONNECTING MATERIAL, CONNECTING STRUCTURE FOR CIRCUIT MEMBER, AND SEMICONDUCTOR DEVICE

The application is a Continuation application of application Ser. No. 11/629,068, filed Dec. 7, 2007, now U.S. Pat. No. 8,138,268 the contents of which are incorporated herein by reference in their entirety. Ser. No. 11/629,068 is a National Stage Application, filed under 35 USC 371, of International (PCT) Application No. PCT/JP2005/010497, filed Jun. 8, 2005.

TECHNICAL FIELD

The present invention relates to an adhesive composition, a circuit connecting material, a connection structure for a circuit member and a semiconductor device.

BACKGROUND ART

As conventional adhesives for semiconductor elements and liquid crystal display units there have been used thermosetting resins such as epoxy resins, which have excellent adhesive properties and exhibit their high adhesion even under high-temperature, high-humidity conditions (for example, see Patent document 1). Such adhesives are heated at 170-250° C. for 1-3 hours for hardening to produce their adhesive properties.

The increasing integration of semiconductor elements and higher precision of liquid crystal devices in recent years have resulted in ever narrowing pitches between elements and wiring.

When such adhesives are used for semiconductor elements and the like, the high temperatures for curing and the slow curing speeds result in heating not only at the desired connections but also at surrounding members, tending to produce damage and the like in the surrounding members.

Throughput must be improved for cost reduction, and therefore a demand exists for adhesion at low temperature (100-170° C.) and in short periods (within an hour), i.e. "low-temperature fast curing".

On the other hand, recent years have seen increasing interest in radical curing adhesives combining acrylate derivatives or methacrylate derivatives with peroxides as radical polymerization initiators. Curing and bonding of such adhesives is accomplished by polymerization reaction of radicals as reactive species with excellent reactivity, thereby allowing curing in relatively short time periods (for example, see Patent document 2).

[Patent document 1] Japanese Patent Application Laid-Open No. H01-113480
[Patent document 2] Japanese Patent Application Laid-Open No. 2002-203427

DISCLOSURE OF THE INVENTION

Problems to be Solved by the Invention

However, the excellent reactivity of radical curing adhesives tends to result in a narrower process margin for curing treatment. For example, when such radical curing adhesives are used for electrical connection of semiconductor elements or liquid crystal display units, even slight variation in the process conditions such as temperature and time for obtaining the cured adhesives will generally make it impossible to obtain stable adhesive strength.

It is therefore an object of the present invention to provide an adhesive composition, a circuit connecting material, a connection structure for a circuit member and a semiconductor device whereby curing treatment can be carried out with sufficient speed at low temperature, curing treatment can be carried out with a wide process margin, and adequately stable adhesive strength can be obtained.

Means for Solving the Problems

The adhesive composition of the invention that solves the problems described above comprises a thermoplastic resin, a radical polymerizing compound, a radical polymerization initiator and a radical polymerization regulator.

This type of adhesive composition allows curing treatment to be carried out with sufficient speed at low temperature, and permits curing treatment with a wide process margin while obtaining adequately stable adhesive strength.

The radical polymerization regulator preferably contains an amine compound having a divalent organic group represented by the following general formula (A).

Specifically, the adhesive composition preferably comprises a thermoplastic resin, a radical polymerizing compound, a radical polymerization initiator and an amine compound having a divalent organic group represented by the following general formula (A).

[Chemical Formula 1]

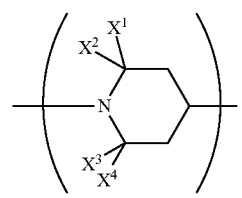

(A)

In formula (A), $X^1$, $X^2$, $X^3$ and $X^4$ independently represent hydrogen or C1-5 alkyl.

The adhesive composition of the invention is a radical curing adhesive composition comprising a thermoplastic resin, a radical polymerizing compound, a radical polymerization initiator and an amine compound. Such an adhesive composition containing a radical polymerizing compound is highly reactive and can therefore be cured in a sufficiently short period even at low temperature. By using an amine compound represented by general formula (1), it is possible to widen the process margin for curing treatment. Cured products obtained from the adhesive composition can exhibit stable adhesive strength even with variation in the process temperature or time used to obtain the cured products. It is also possible to prevent reduction in the adhesive strength of the cured adhesive composition with passage of time.

Since the use of such an adhesive composition according to the invention allows curing treatment to be accomplished in a short period and can widen the process margin, even when the pitch between elements and wirings of semiconductor elements or liquid crystal devices is narrow it is possible to prevent heating at surrounding members instead of only at the desired connections, which causes damage and the like in the surrounding members, and therefore the throughput can be improved.

The radical polymerization regulator is preferably represented by the following general formula (1).

[Chemical Formula 2]

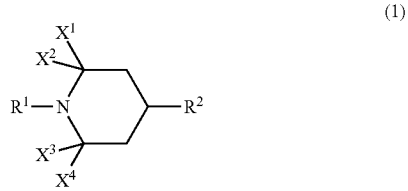

(1)

In formula (1), $R^1$ and $R^2$ each independently represent hydrogen, hydroxyl or a monovalent organic group, and $X^1$, $X^2$, $X^3$ and $X^4$ each independently represent hydrogen or C1-5 alkyl.

If the amine compound is represented by general formula (1) above, the process margin for curing treatment can be widened even further.

More preferably, $R^1$ is hydrogen, hydroxyl, C1-10 alkyl, aryl, C2-20 alkoxy, or a monovalent organic group represented by the following general formula (2).

[Chemical Formula 3]

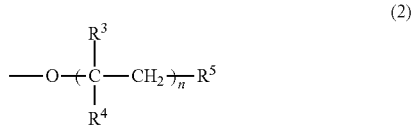

(2)

In formula (2), $R^3$ represents hydrogen or C1-5 alkyl, $R^4$ represents C1-5 ester, benzyl ester, carboxyl or aryl, $R^5$ represents hydrogen, C1-20 alkyl, C1-20 alkoxy, phenoxy, aryl, C1-20 carbonyloxy, phenylcarbonyloxy or vinyl and n represents an integer of 1-20, where phenoxy, aryl and phenylcarbonyloxy may be optionally substituted with C1-5 alkyl.

If $R^1$ is hydrogen, hydroxyl, C1-10 alkyl, aryl, C2-20 alkoxy or a group represented by general formula (2) above, the process margin for curing treatment can be widened yet further.

The radical polymerization regulator preferably has at least one aminoxyl structure in the molecule. Since the radical polymerization regulator exists as a stable radical even in air, it provides the advantage of improved storage stability.

The radical polymerizing compound in the adhesive composition of the invention preferably has two or more (meth) acryloyl groups in the molecule. Using such an adhesive composition will allow curing treatment to be accomplished in an even shorter period of time. The present inventors attribute this to the fact that the radical polymerizing compound has two or more (meth)acryloyl groups as highly reactive radical reactive groups.

Furthermore, since the radical polymerizing compound uses a (meth)acryloyl group as the reactive group, it is possible to obtain firm adhesion regardless of the material of the adherend. Thus, the adhesive composition of the invention comprising such a radical polymerizing compound has high general utility, and can provide more stable adhesive strength when used for semiconductor elements and liquid crystal display units, for example.

The radical polymerization initiator is preferably a peroxy ester derivative having a one-minute half-life temperature of 90-175° C. Here, a "one-minute half-life temperature" is the temperature at which the half-life is one minute, and the "half-life" is the time in which the compound concentration is reduced to half its initial value.

If the one-minute half-life temperature of the radical polymerization initiator is 90-175° C., the cured product obtained from the adhesive composition of the invention will be able to exhibit more excellent connection resistance compared to conventional products. It will also be possible to prevent reduction in the connection resistance of the cured adhesive composition with passage of time.

The radical polymerization initiator is preferably a peroxy ester derivative with a molecular weight of 180-1000. If the radical polymerization initiator is a peroxy ester derivative and its molecular weight is within the numerical range stated above, its compatibility with other radical polymerizing compounds will be excellent and the obtained cured product will exhibit more stable properties such as adhesive strength and connection resistance throughout the entire product.

The adhesive composition of the invention preferably contains the radical polymerizing compound at 50-250 parts by weight, the radical polymerization initiator at 0.05-30 parts by weight and the radical polymerization regulator at 0.001-30 parts by weight with respect to 100 parts by weight of the thermoplastic resin. The adhesive composition of the invention can exhibit a more notable effect of the invention if the constituent materials are added within the ranges specified above.

The adhesive composition also preferably contains conductive particles. Such an adhesive composition will exhibit conductivity. This will allow the adhesive composition to be used as a conductive adhesive in fields such as electrical and electronic industries for circuit electrodes, semiconductors and the like. A conductive adhesive composition can also reduce connection resistance after curing.

The proportion of conductive particles added is preferably 0.5-30 parts by weight of the conductive particles with respect to 100 parts by weight of the thermoplastic resin. An adhesive composition having conductive particles added within this range will be able to more fully exhibit the effect of the conductive particles. When used for connection of circuit electrodes, for example, it is possible to prevent lack of conduction between opposing circuit electrodes or shorting between adjacent circuit electrodes. In addition, the adhesive composition containing conductive particles in the proportion described above exhibits electrical connection anisotropy, and can be used as an anisotropic conductive adhesive composition.

The circuit connecting material of the invention is a circuit connecting material for electrical connection between opposing circuit electrodes, and the circuit connecting material is characterized by comprising the aforementioned adhesive composition.

This type of circuit connecting material can sufficiently shorten the time period for bonding between opposing circuit electrodes even at low temperature, and can widen the process margin. Cured products obtained from the circuit connecting material can exhibit stable adhesive strength even with variation in the process temperature or time used to obtain the cured products. It is also possible to prevent reduction in the adhesive strength of the cured circuit connecting material with passage of time. Furthermore, if the circuit connecting material contains conductive particles in the proportion mentioned above, it can exhibit electrical connection anisotropy and can be used as an anisotropic conductive circuit connecting material for circuit electrodes.

The adhesive composition or circuit connecting material described above is preferably formed into a film. A film-like adhesive composition or circuit connecting material has excellent handleability and can therefore further improve the throughput.

When opposing circuit members are bonded by heating under conditions with a compression time of 10 seconds, a pressure of 3 MPa and a heating temperature of 140-200° C., the maximum value of the connection resistance between the heat bonded connection members in the entire heating temperature range is preferably no greater than 3 times the minimum value. This will allow the process margin to be further widened.

The connection structure for a circuit member of the invention is a connection structure for a circuit member comprising a first circuit member having a first circuit electrode formed on the main side of a first circuit board, a second circuit member having a second circuit electrode formed on the main side of a second circuit board, and a circuit connecting member formed between the main side of the first circuit board and the main side of the second circuit board, which electrically connects the first circuit electrode and second circuit electrode positioned opposite each other, characterized in that the circuit connecting member is a cured product of the aforementioned circuit connecting material.

This type of connection structure for a circuit member allows electrically connected circuit electrodes to be effectively utilized. That is, since the aforementioned circuit connecting material is used to allow electrical connection between the first circuit electrode and second circuit electrode, a circuit member having the connection structure of the invention has little quality variation and exhibits sufficiently stable properties. Furthermore, a cured product of the circuit connecting material containing conductive particles can lower the connection resistance. Addition of conductive particles can prevent loss of conduction between opposing circuit electrodes or shorting between adjacent circuit electrodes. If the conductive particles are added in the proportion mentioned above, it is also possible to achieve electrical connection anisotropy to obtain an anisotropic circuit connecting material.

The semiconductor device of the invention is a semiconductor device comprising a semiconductor element, a base on which the semiconductor element is mounted, and a semiconductor element connecting member provided between the semiconductor element and the base and electrically connecting the semiconductor element and the base, characterized in that the semiconductor element connecting member is a cured product or adhesive film made of the aforementioned adhesive composition.

Since the cured product of an adhesive composition electrically connecting the semiconductor element and the base in the semiconductor device as described above is a cured product of the aforementioned adhesive composition, it has little quality variation and can exhibit sufficiently stable properties. Furthermore, a cured product of the adhesive composition that contains conductive particles can lower the connection resistance. Addition of the conductive particles can adequately ensure conductivity between the opposing semiconductor element and base. If the conductive particles are added in the proportion mentioned above, it is also possible to achieve electrical connection anisotropy to obtain an anisotropic semiconductor.

Effect of the Invention

According to the present invention it is possible to provide an adhesive composition, a circuit connecting material, a connection structure for a circuit member and a semiconductor device whereby curing treatment can be carried out with sufficient speed at low temperature, curing treatment can be carried out with a wide process margin, and adequately stable adhesive strength can be obtained.

EXPLANATION OF SYMBOLS

Figure 1:
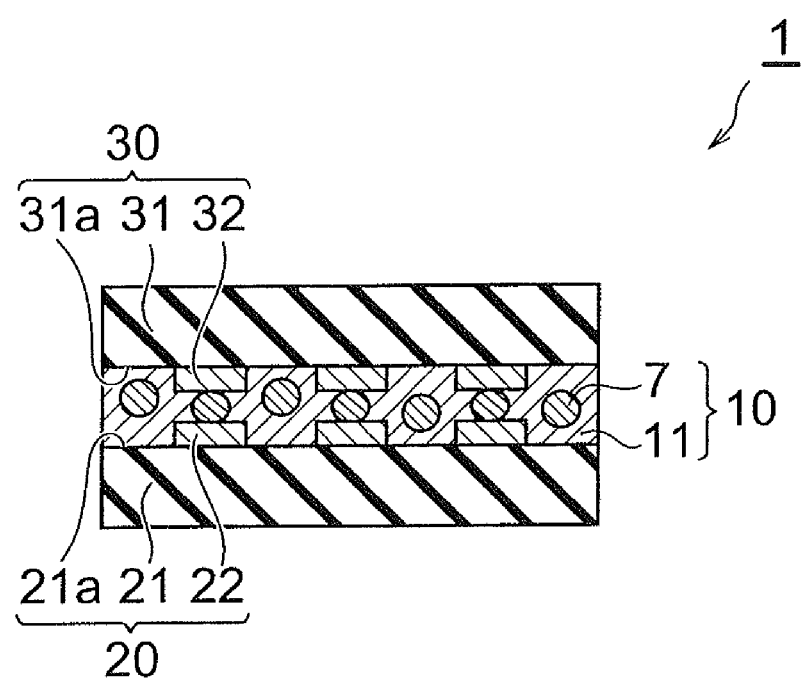
FIG. 1 is a simplified cross-sectional view showing an embodiment of a connection structure for a circuit member according to the invention.

1: Connection structure for a circuit member, 2: semiconductor device, 7: conductive particles, 10: circuit connecting member, 11: insulating substance, 20: first circuit member, 21: first circuit board, 22: first circuit electrode, 30: second circuit member, 31: second circuit board, 32: second circuit electrode, 40: semiconductor element connection member, 50: semiconductor element, 60: base, 61: circuit pattern, 70: sealing material.

BEST MODE FOR CARRYING OUT THE INVENTION

Preferred embodiments of the invention will now be explained with reference to the accompanying drawings where necessary. Corresponding elements will be referred to by like reference numerals and will be explained only once. Throughout the following explanation, "(meth)acrylate" means "acrylate" or its corresponding "methacrylate".

(Adhesive Composition)

The adhesive composition of the invention comprises a thermoplastic resin, a radical polymerizing compound, a radical polymerization initiator and a radical polymerization regulator. This type of adhesive composition allows curing treatment to be carried out with sufficient speed at low temperature, and permits curing treatment with a wide process margin while obtaining adequately stable adhesive strength.

Each of the components will now be explained in detail.

[Radical Polymerization Regulator]

The radical polymerization regulator for the invention may be any publicly known one without any particular restrictions, so long as it is a compound that rapidly reacts with the initiating radical generated by decomposition of the radical polymerization initiator such as a peroxide during heat curing, or with the growth radical produced when the initiating radical attacks the radical polymerizing compound, and reproduces the radical by heating at 60° C. or above to promote polymerization of the radical polymerizing compound.

Preferred among these are amine compounds with a divalent organic group represented by the following general formula (A).

[Chemical Formula 4]

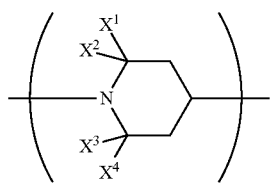

In formula (A), $X^1$, $X^2$, $X^3$ and $X^4$ each independently represent hydrogen or C1-5 alkyl. Here, "alkyl" includes not only straight-chain alkyl but branched and cyclic alkyl groups.

By using an amine compound represented by general formula (A) above, it is possible to widen the process margin for curing treatment. Cured products obtained from the adhesive composition can exhibit stable adhesive strength even with variation in the process temperature or time used to obtain the cured products. It is also possible to prevent reduction in the adhesive strength of the cured adhesive composition with passage of time.

Since the use of such an adhesive composition according to the invention allows curing treatment to be accomplished in a short period and can widen the process margin, even when the pitch between elements and wirings of semiconductor elements or liquid crystal devices is narrow it is possible to prevent heating at surrounding members instead of only at the desired connections, which causes damage and the like in the surrounding members, and therefore the throughput can be improved.

The amine compound is preferably one represented by the following general formula (1). Using such a compound as the amine compound can further widen the process margin for curing treatment.

[Chemical Formula 5]

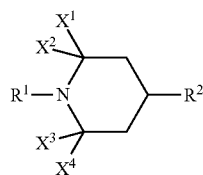

In formula (1), $R^1$ and $R^2$ each independently represent hydrogen, hydroxyl or a monovalent organic group, and $X^1$, $X^2$, $X^3$ and $X^4$ each independently represent hydrogen or C1-5 alkyl. An organic group is a carbon-containing substituent, and there are no particular restrictions on the rest of the structure of the substituent. As monovalent organic groups to be used as $R^2$ there are preferred C1-10 alkyl, aryl, C2-20 alkoxy, ether and ester groups. Methyl may be mentioned as an example of a C1-10 alkyl group, and octoxy may be mentioned as an example of a C2-20 alkoxy group. When $R^2$ is hydroxyl, the ester group may be obtained by ester reaction with a monocarboxylic acid such as methacrylic acid or 2-methylhexanoic acid, a dicarboxylic acid such as sebacic acid, or a tetracarboxylic acid.

$R^1$ in general formula (1) is preferably hydrogen, hydroxyl, C1-10 alkyl, aryl, C2-20 alkoxy, or a monovalent organic group represented by the following general formula (2).

Using such a substituent as $R^1$ can further widen the process margin for curing treatment. Methyl may be mentioned as an example of a C1-10 alkyl group, and octoxy may be mentioned as an example of a C2-20 alkoxy group.

[Chemical Formula 6]

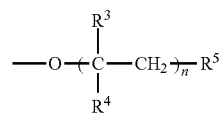

In formula (2), $R^3$ represents hydrogen or C1-5 alkyl, $R^4$ represents C1-5 ester, benzyl ester, carboxyl or aryl, $R^5$ represents hydrogen, C1-20 alkyl, C1-20 alkoxy, phenoxy, aryl, C1-20 carbonyloxy, phenylcarbonyloxy or vinyl and n represents an integer of 1-20, where phenoxy, aryl and phenylcarbonyloxy may be optionally substituted with C1-5 alkyl.

The reason why a cured product with satisfactorily stable adhesive strength is obtained using the adhesive composition of the invention is not fully understood at the current time. As one cause, however, the present inventors conjecture that the amine compound stabilizes the radical polymerization reaction, thus yielding a relatively stable cured product even when the process conditions vary. However, this is not necessarily the only reason.

As specific amine compounds there may be mentioned N,N'-bis(3-aminopropyl)ethylenediamine and 2,4-bis[N-butyl-N-(1,2,2,6,6-pentamethyl-4-piperidyl)amino]-6-chloro-1,3,5-triazine condensate, and poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}]. In addition, there may be mentioned compounds represented by the following chemical formulas (3)-(11) and (13)-(16), and polymers obtained by introducing a substituent represented by general formula (1) above at a side chain of a polyamine, polyester, polyacrylate or the like. These compounds may be used alone, or two or more different compounds may be used in combination.

[Chemical Formula 7]

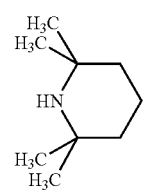

[Chemical Formula 8]

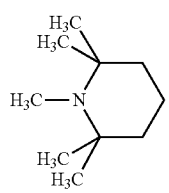

-continued

[Chemical Formula 9]

(5)

[Chemical Formula 10]

(6)

[Chemical Formula 11]

(7)

[Chemical Formula 12]

(8)

[Chemical Formula 13]

(9)

[Chemical Formula 14]

(10)

[Chemical Formula 15]

(11)

In formula (11), $R^{10}$ is a group represented by formula (12a) or (12b) below.

[Chemical Formula 16]

(12a)

[Chemical Formula 17]

(12b)

[Chemical Formula 18]

(13)

In formula (13), m represents a positive integer.

[Chemical Formula 19]

(14)

[Chemical Formula 20]

(15)

[Chemical Formula 21]

(16)

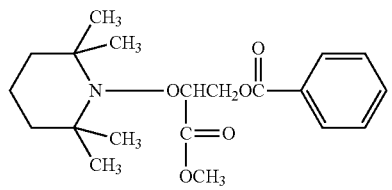

The radical polymerization regulator used for the invention preferably has at least one aminoxyl structure in the molecule. Since the radical polymerization regulator exists as a stable radical even in air, it provides the advantage of improved storage stability.

As compounds having the aforementioned aminoxyl structure there may be mentioned, specifically, 2,2,6,6-tetramethylpiperidine-1-oxyl, 2,2-dimethyl-6-phenylpiperidine-1-oxyl, 2,2,6-trimethyl-6-phenylpiperidine-1-oxyl, 2,6-diphenylpiperidine-1-oxyl, 4-acetamide-2,2,6,6-tetramethylpiperidine-1-oxyl, 4-amino-2,2,6,6-tetramethylpiperidine-1-oxyl, 4-carboxy-2,2,6,6-tetramethylpiperidine-1-oxyl, 3-carboxy-2,2,6,6-tetramethylpiperidine-1-oxyl, 4-(2-chloroacetamide)-2,2,6,6-tetramethylpiperidine-1-oxyl, 4-hydroxy-2,2,6,6-tetramethylpiperidine-1-oxyl, 4-hydroxy-2,2,6,6-tetramethylpiperidine-1-oxylbenzoate, 4-(2-iodoacetamide)-2,2,6,6-tetramethylpiperidine-1-oxyl, 4-isothiocyanato-2,2,6,6-tetramethylpiperidine-1-oxyl, 4-isocyanato-2,2,6,6-tetramethylpiperidine-1-oxyl, 4-methoxy-2,2,6,6-tetramethylpiperidine-1-oxyl, 4-oxo-2,2,6,6-tetramethylpiperidine-1-oxyl, 2,2-dimethyl-6-cyclohexylpiperidine-1-oxyl, 2,6-dicyclohexylpiperidine-1-oxyl, 2,2-dimethyl-6-cyclopentylpiperidine-1-oxyl, 2,6-dicyclopentylpiperidine-1-oxyl, 2,2,5-trimethyl-4-phenyl-3-azahexane-3-nitrooxide, 2,2,5,5-tetramethylpyrrolidine-1-oxyl, 2,5-diphenylpyrrolidine-1-oxyl, 2,2-dimethyl-5-phenylpyrrolidine-1-oxyl, 2,2,5-trimethyl-5-phenylpyrrolidine-1-oxyl, and the like.

As other compounds with aminoxyl structures there may be mentioned the radical-generating compounds represented by the following general formulas (17) and (18).

[Chemical Formula 22]

(17)

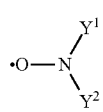

In formula (17), $Y^1$ and $Y^2$ each independently represent C1-5 alkyl such as isopropyl, t-butyl or the like, aryl, C2-20 alkoxy or C5-10 cycloalkyl. The aryl group may be optionally substituted with C1-5 alkyl or C1-5 alkoxy.

[Chemical Formula 23]

(18)

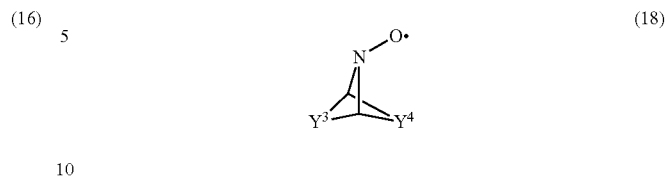

In formula (18), $Y^3$ and $Y^4$ each independently represent a C1-5 alkylene chain.

As other compounds with aminoxyl structures there may be mentioned the radical-generating compounds represented by the following general formulas (19)-(21), and polymers obtained by introducing an aminoxyl structure at a side chain of a polyamine, polyester, polyacrylate or the like.

[Chemical Formula 24]

(19)

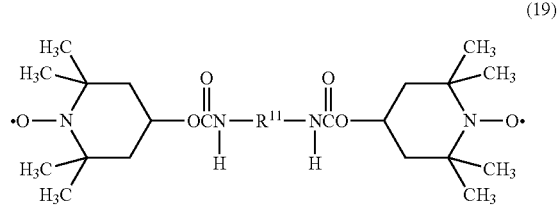

In formula (19), $R^{11}$ represents a C1-5 alkylene chain or a phenylene chain.

[Chemical Formula 25]

(20)

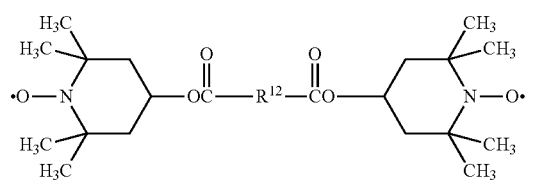

In formula (20), $R^{12}$ represents a C1-5 alkylene chain or a phenylene chain.

[Chemical Formula 26]

(21)

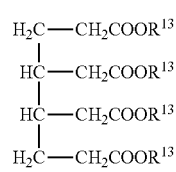

In formula (21), $R^{13}$ is a group represented by the following formula (12c).

[Chemical Formula 27]

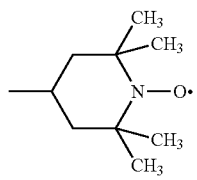

(12c)

The compound having an aminoxyl structure may be used alone, or two or more different such compounds may be used in admixture.

The amount of radical polymerization regulator added is preferably 0.001-30 parts by weight and more preferably 0.001-10 parts by weight with respect to 100 parts by weight of the thermoplastic resin. If the amount of radical polymerization regulator added is less than 0.001 parts by weight, the effect of addition will tend to be reduced compared to when the amount of addition is within the range specified above, while if the amount of radical polymerization regulator added is greater than 30 parts by weight, the radical polymerization regulator addition becomes excessive and impairs the curing property while preventing further improvement in adhesive strength stabilizing effect, and tending to reduce compatibility with other radical polymerizing compounds.

From the standpoint of widening the process margin, the amount of radical polymerization regulator added is preferably 0.01-30 parts by weight with respect to 100 parts by weight of the thermoplastic resin. If the amount of radical polymerization regulator added is less than 0.01 part by weight, the radical polymerization regulator addition will be so low as to impede widening of the process margin, tending to result in poorer stabilization of the adhesive strength. The amount of radical polymerization regulator addition is more preferably 0.01-10 parts by weight and even more preferably 0.05-10 parts by weight with respect to 100 parts by weight of the thermoplastic resin.

[Thermoplastic Resin]

The thermoplastic resin of the invention may be used to reinforce adhesion between objects to be bonded (hereinafter referred to simply as "adherends").

The thermoplastic resin used for the invention may be any publicly known one, without any particular restrictions. Specifically, there may be used polyamides, phenoxy resins, poly (meth)acrylates, polyimides, polyurethanes, polyesters, polyvinylbutyrals and the like. These may be used alone or in combinations of two or more. The resins may also have siloxane bonds or fluorine substituents in the molecule. These may be suitably used in a state which produces complete compatibilization between resins, or which produces microphase separation and turbidity.

A larger molecular weight of the thermoplastic resin will allow easier formation of a film as described hereunder, while the solution viscosity, which affects the flow properties of the adhesive, may be set within a wide range. Since the solution viscosity can be set within a wide range, attachment of the adhesive onto surrounding members can be further prevented when the composition is used for connection of semiconductor elements or liquid crystal devices even when the pitch between elements and wirings is narrow, and therefore the throughput can be improved. However, a molecular weight of greater than 150,000 will tend to produce inferior compatibility with other components, while a molecular weight of less than 5000 will tend to result in unsatisfactory film formation when the composition is used as a film as described hereunder. The molecular weight, in terms of weight-average molecular weight, is therefore preferably 5000-150,000 and more preferably 10,000-80,000.

[Radical Polymerizing Compound]

The radical polymerizing compound of the invention is a compound having the property of generating radicals upon input of energy and forming a polymer by chain reaction polymerization of the radicals. The radical polymerization reaction normally proceeds more rapidly than cation polymerization or anion polymerization. According to the invention employing a radical polymerizing compound, it is therefore possible to accomplish polymerization within a relatively short period of time.

The radical polymerizing compound used for the invention may be any publicly known one without any particular restrictions, so long as it is a compound having an olefin group in the molecule, such as (meth)acryl, (meth)acryloyl or vinyl, or a compound that polymerizes via radicals, such as styrene derivatives or maleimide derivatives. Preferred among these are radical polymerizing compounds having (meth)acryloyl groups, with compounds having two or more (meth)acryloyl groups being more preferred.

As radical polymerizing compounds with (meth)acryloyl groups there may be mentioned oligomers such as epoxy (meth)acrylate oligomers, urethane(meth)acrylate oligomers, polyether(meth)acrylate oligomers and polyester (meth)acrylate oligomers, and polyfunctional (meth)acrylate compounds such as trimethylolpropane tri(meth)acrylate, polyethyleneglycol di(meth)acrylate, polyalkyleneglycol di(meth)acrylate, dicyclopentenyl(meth)acrylate, dicyclopentenyloxyethyl(meth)acrylate, neopentylglycol di(meth) acrylate, dipentaerythritol hexa(meth)acrylate, isocyanuric acid-modified bifunctional (meth)acrylates, isocyanuric acid-modified trifunctional (meth)acrylates, 2,2'-di(meth) acryloyloxydiethyl phosphate, 2-(meth)acryloyloxyethyl acid phosphate, and the like. These compounds may be used alone or in combinations of two or more as necessary.

Using a (meth)acryloyl group as the reactive group can produce firm bonding regardless of the material quality of the adherend. As adherends there may be mentioned printed circuit boards and polyimide or other organic base materials, as well as metals such as copper and aluminum, or ITO (indium tin oxide), silicon nitride (SiN), silicon dioxide ($SiO_2$) and the like.

The radical polymerizing compound preferably has two or more (meth)acryloyl groups in the molecule, because the heating time required for bonding will be further shortened and the heating temperature required for bonding will be further lowered. This is attributed to a larger number of (meth) acryloyl groups as radical reactive groups in the molecule of the radical polymerizing compound.

The proportion of the radical polymerizing compound added is preferably 50-250 parts by weight and more preferably 60-150 parts by weight with respect to 100 parts by weight of the thermoplastic resin. If the proportion of the radical polymerizing compound added is less than 50 parts by weight, the heat resistance of the cured adhesive composition attached to the adherend will tend to be reduced, and if it is greater than 250 parts by weight, the film formation will tend to be unsatisfactory when the adhesive composition is used as a film as described hereunder.

[Radical Polymerization Initiator]

The adhesive composition of the invention comprises a radical polymerization initiator. Once the radical polymerization reaction has been initiated, the radical polymerizing compound undergoes a chain reaction to produce rigid curing, but because it is relatively difficult to generate the first radicals, a radical polymerization initiator capable of producing radicals relatively easily is included.

The radical polymerization initiator used for the invention may be a publicly known peroxide or azo compound known in the prior art. Specifically, there may be mentioned cumylperoxy neodecanoate, 1,1,3,3-tetramethylbutylperoxy neodecanoate, 1-cyclohexyl-1-methylethylperoxy neodecanoate, t-hexylperoxy neodecanoate, t-butylperoxy neodecanoate, t-butylperoxy pivalate, 1,1,3,3-tetramethylbutylperoxy-2-ethyl hexanoate, 2,5-dimethyl-2,5-di(2-ethylhexanoylperoxy)hexane, t-hexylperoxy-2-ethyl hexanoate, t-butylperoxy-2-ethyl hexanoate, t-butylperoxy neoheptanoate, t-amylperoxy-2-ethyl hexanoate, di-t-butylperoxy hexahydroterephthalate, t-amylperoxy-3,5,5-trimethyl hexanoate, 3-hydroxy-1,1-dimethylbutylperoxy neodecanoate, 1,1,3,3-tetramethylbutylperoxy-2-ethyl hexanoate, t-amylperoxy neodecanoate, t-amylperoxy-2-ethyl hexanoate, 2,2'-azobis-2,4-dimethylvaleronitrile, 1,1'-azobis(1-acetoxy-1-phenylethane), 2,2'-azobisisobutyronitrile, 2,2'-azobis(2-methylbutyronitrile), dimethyl-2,2'-azobisisobutyronitrile, 4,4'-azobis (4-cyanovaleric acid), 1,1'-azobis(1-cyclohexanecarbonitrile), t-hexylperoxyisopropyl monocarbonate, t-butylperoxymaleic acid ester, t-butylperoxy-3,5,5-trimethyl hexanoate, t-butylperoxy laurate, 2,5-dimethyl-2,5-di(3-methylbenzoylperoxy)hexane, t-butylperoxy-2-ethylhexyl monocarbonate, t-hexylperoxy benzoate, 2,5-dimethyl-2,5-di(benzoylperoxy)hexane, t-butylperoxy benzoate, dibutylperoxytrimethyl adipate, t-amylperoxy normal-octoate, t-amylperoxy isononanoate, t-amylperoxy benzoate, and the like. These compounds may be used alone, or two or more different compounds may be used in combination.

Preferred among these are peroxy ester derivatives, so that the radical polymerization initiator has a one-minute half-life temperature of 90-175° C. If the one-minute half-life temperature of the radical polymerization initiator is 90-175° C., the cured product obtained from the adhesive composition of the invention will be able to exhibit more excellent connection resistance compared to conventional products. It will also be possible to prevent reduction in the connection resistance of the cured adhesive composition with passage of time.

Also preferred are peroxy ester derivatives with molecular weights of 180-1000. If the radical polymerization initiator is a peroxy ester derivative and its molecular weight is within the numerical range stated above, its compatibility with other radical polymerizing compounds will be excellent and the obtained cured product will exhibit more stable properties such as adhesive strength and connection resistance throughout the entire product.

The amount of radical polymerization initiator added is preferably 0.05-30 parts by weight and more preferably 0.1-20 parts by weight with respect to 100 parts by weight of the thermoplastic resin. If the amount of radical polymerization initiator added is less than 0.05 parts by weight, the radical polymerization may not be adequately initiated, whereas if the amount of radical polymerization initiator added is greater than 30 parts by weight, the storage stability will tend to be reduced.

There are no particular restrictions on the form of energy used for the invention, and there may be mentioned heat, electron beam, gamma rays, ultraviolet rays, infrared rays and the like.

The adhesive composition of the invention also preferably contains conductive particles. Adding conductive particles can confer conductivity to the adhesive composition. This will allow its use as a conductive adhesive in fields such as electrical and electronic industries for circuit electrodes, semiconductors and the like.

The conductive particles used are not particularly restricted so long as they have a degree of conductivity permitting electrical connection, and as examples there may be mentioned metals such as Au, Ag, Ni, Cu, solder and the like, or carbon. Alternatively, non-conductive glass, ceramic, plastic or the like may be used as a core covered with the aforementioned metals or carbon. Preferably, the metal itself is a heat-fusible metal, or a plastic core is covered with a metal or carbon. This will further facilitate deformation of the cured adhesive composition by heat or pressure, thereby increasing the contact area between the electrodes and the adhesive composition when it is used for electrical connection between electrodes, and improving the conductivity between electrodes.

The surfaces of the conductive particles may also be covered with a polymer resin for use as laminar particles. If laminar conductive particles are added to the adhesive composition, shorting by contact between conductive particles will be further inhibited due to the resin covering even if the amount of conductive particles is increased, and therefore the insulating property between electrode circuits can be improved. The conductive particles or laminar particles may be used alone or in combinations of two or more different types.

The mean particle size of the conductive particles is preferably 1-18 μm from the viewpoint of dispersibility and conductivity. The proportion of conductive particles added is preferably 0.1-30 vol % and more preferably 0.1-10 vol % with respect to 100 vol % of the adhesive composition. If this value is less than 0.1 vol % it may not be possible to achieve adequate conductivity, and if it is greater than 30 vol % there will be a greater tendency toward circuit shorting. The proportion of conductive particles (vol %) is determined based on the volume of each component before curing of the adhesive composition at 23° C., and the volume of each component may be measured by a method of calculating the volume from the weight based on the specific gravity, or a method of loading the component into a vessel such as a graduated cylinder containing an appropriate solvent (water, alcohol or the like) that thoroughly wets the component without dissolving or swelling it, and performing calculation based on the increased volume.

A bonding aid such as a coupling agent, adhesion enhancer, leveling agent or the like, typically an alkoxysilane derivative or silazane derivative, is preferably added to the adhesive composition of the invention. This will allow the effect of the invention to be more notably exhibited, and can also provide satisfactory adhesion and handleability. Specifically, there is preferably added a compound represented by the following general formula (17).

[Chemical Formula 28]

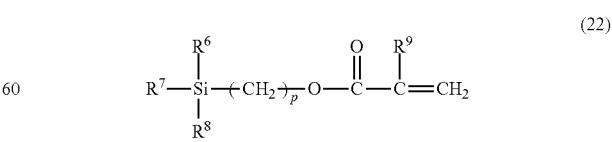

(22)

In formula (22), $R^6$, $R^7$ and $R^8$ each independently represent hydrogen, C1-5 alkyl, C1-5 alkoxy, C1-5 alkoxycarbonyl or aryl, $R^9$ represents hydrogen or methyl, and p represents an integer of 1-10.

Also in general formula (22), $R^6$ is preferably C1-5 alkyl or aryl, $R^7$ and $R^8$ are each independently C2-3 alkoxy and p is 2-4 for more excellent adhesive properties and connection resistance. A compound represented by general formula (22) may be used alone, or two or more different ones may be used in combination.

The adhesive composition of the invention may also contain other added materials as suited for the purpose of use. For example, an adhesion enhancer may be added to increase the crosslinking rate of the adhesive. This can further enhance the adhesive strength. Specifically, in addition to the radical polymerizing compound with a (meth)acryloyl group, there may be added a compound with a radical polymerizing functional group such as allyl, maleimide or vinyl. Specifically, there may be mentioned N-vinylimidazole, N-vinylpyridine, N-vinylpyrrolidone, N-vinylformamide, N-vinylcaprolactam, 4,4'-vinylidenebis(N,N-dimethylaniline), N-vinylacetamide, N,N-dimethylacrylamide, N-isopropylacrylamide and N,N-diethylacrylamide. These adhesion enhancers may be used alone, or two or more different ones may be used in combination.

A flow property enhancer such as a monofunctional (meth)acrylate may also be added. This will allow the flow property to be improved. Specifically, there may be mentioned pentaerythritol(meth)acrylate, 2-cyanoethyl(meth)acrylate, cyclohexyl(meth)acrylate, dicyclopentenyl(meth)acrylate, dicyclopentenyloxyethyl(meth)acrylate, 2-(2-ethoxy)ethyl(meth)acrylate, 2-ethoxyethyl(meth)acrylate, 2-ethylhexyl(meth)acrylate, n-hexyl(meth)acrylate, 2-hydroxyethyl(meth)acrylate, hydroxypropyl(meth)acrylate, isobornyl(meth)acrylate, isodecyl(meth)acrylate, isooctyl(meth)acrylate, n-lauryl(meth)acrylate, 2-methoxyethyl(meth)acrylate, 2-phenoxyethyl(meth)acrylate, tetrahydrofurfuryl(meth)acrylate, 2-(meth)acryloyloxyethyl phosphate, N,N-dimethylaminoethyl(meth)acrylate, N,N-dimethylaminopropyl(meth)acrylate and (meth)acryloylmorpholine. These flow property enhancers may be used alone, or two or more different ones may be used in combination.

A rubber-based material may also be used for improved adhesion. It can also act as a stress reliever. Specifically, there may be mentioned polyisoprene, polybutadiene, carboxy-terminated polybutadiene, hydroxy-terminated polybutadiene, 1,2-polybutadiene, carboxy-terminated 1,2-polybutadiene, hydroxy-terminated 1,2-polybutadiene, acryl rubber, styrene-butadiene rubber, hydroxy-terminated styrene-butadiene rubber, acrylonitrile-butadiene rubber, carboxyl, hydroxyl, acrylonitrile-butadiene rubber having a (meth)acryloyl or morpholine group at the polymer terminal, carboxylated nitrile rubber, hydroxy-terminated poly(oxypropylene), alkoxysilyl-terminated poly(oxypropylene), poly(oxytetramethylene)glycol, polyolefin glycols and poly-ε-caprolactone.

From the viewpoint of enhancing adhesion, the rubber-based material is preferably a rubber-based material containing a highly polar functional group such as cyano or carboxyl on a side chain or at the end, while from the viewpoint of improving the flow property it is even more preferably a liquid. Specifically, there may be mentioned liquid acrylonitrile-butadiene rubber, liquid acrylonitrile-butadiene rubber containing a carboxyl, hydroxyl or (meth)acryloyl group at the polymer terminal and liquid carboxylated nitrile rubber, while the content of acrylonitrile as the polar group is preferably 10-60 wt % of the entire rubber-based material. These rubber-based materials may be used alone, or two or more different ones may be used in combination.

There may also be included additives such as polymerization inhibitors, which are typically t-butylpyrocatechol, t-butylphenol, p-methoxyphenol and the like. These can also increase the storage stability.

The adhesive composition of the invention may be used in paste form if it is a liquid at ordinary temperature. When it is a solid at ordinary temperature, it may be heated into a paste, or dissolved in a solvent to form a paste. The solvent used is not particularly restricted so long as it does not react with the adhesive composition and exhibits sufficient solubility, but it is preferably one with a boiling point of 50-150° C. at ordinary pressure. If the boiling point is below 50° C. it will tend to volatilize readily at room temperature, thus requiring the radical polymerization reaction to be carried out in a sealed environment and tending to limit its scope of use. If the boiling point is above 150° C., it will be difficult to volatilize off the solvent, and sufficient adhesive strength may not be achieved after bonding.

The adhesive composition of the invention may also be used after its shaping into a film. The method of forming the film may involve coating a mixture of the adhesive composition and a solvent onto a releasable base such as a fluorine resin film, a polyethylene terephthalate film or a release sheet, or impregnating a nonwoven fabric or the like with the mixture and placing it on a releasable base, and then removing the solvent to obtain a film. Forming the adhesive composition into a film in this manner provides the additional advantage of excellent handleability.

Formation of a film with conductive particles added to the adhesive composition of the invention can yield an anisotropic conductive film. The anisotropic conductive film may be placed between opposing electrodes on a board, for example, and subjected to heating and pressure to bond the electrodes together while forming an electrical connection. As boards for formation of such electrodes, there may be used inorganic substances such as semiconductors, glass, ceramic or the like organic materials such as polyimides or polycarbonates, or combinations thereof such as glass/epoxy.

The adhesive composition of the invention may also be bonded with a combination of heating and pressurization. The heating temperature is preferably 100-250° C. and more preferably 140-200° C. The pressure may be in a range that does not damage the adherend, and it is preferably 0.1-10 MPa. The heating and pressurization are preferably carried out for a period in a range of 0.5-120 seconds. Thus, the adhesive composition of the invention may be used for bonding of an adherend at, for example, a temperature of 140-200° C. and a pressure of 3 MPa for 10 seconds.

The adhesive composition of the invention may also be suitably used as a circuit connecting material because the reaction can be completed in a short period and the adhesive strength is excellent. For example, when the circuit electrode of a first circuit member and the circuit electrode of a second circuit member are to be electrically connected, the adhesive composition of the invention may be attached to one of the circuit electrodes with the circuit members situated facing each other, and the other circuit electrode electrically connected thereto by radical polymerization reaction. When the adhesive composition is thus used as a circuit connecting material, electrical connection can be achieved in a short period and the adhesive strength can be stabilized even if the process temperature or time for the connection vary. It is also possible to prevent reduction in the adhesive strength of the cured circuit connecting material with passage of time. If conductive particles are added to the circuit connecting material, it can exhibit electrical connection anisotropy, for use as an anisotropic conductive circuit connecting material for circuit electrodes.

When opposing circuit members are bonded by heating under conditions with a compression time of 10 seconds, a pressure of 3 MPa and a heating temperature of 140-200° C., the maximum value of the connection resistance between the heat bonded connection members in the entire heating temperature range is preferably no greater than 3 times the minimum value. This will allow the process margin to be further widened.

The circuit connecting material may also be used as a circuit connecting material for different types of adherends with different thermal expansion coefficients. Specifically, it may be used as a circuit connecting material such as an anisotropic conductive adhesive, silver paste, silver film or the like, or as a semiconductor element adhesive material such as CSP elastomer, CSP underfill material, LOC tape or the like.

(Connection Structure for a Circuit Member)

A preferred embodiment of a connection structure for a circuit member of the invention will now be explained. FIG. 1 is a simplified cross-sectional view showing an embodiment of a connection structure for a circuit member according to the invention. As shown in FIG. 1, the connection structure 1 for a circuit member of this embodiment comprises a first circuit member 20 and a second circuit member 30 which are mutually opposing, and a circuit connecting member 10 which is formed between the first circuit member 20 and second circuit member 30 and electrically connects them. The first circuit member 20 comprises a first circuit board 21 and a first circuit electrode 22 formed on the main side 21a of the circuit board 21. An insulating layer (not shown) may also be formed on the main side 21a of the circuit board 21.

The second circuit member 30 comprises a second circuit board 31 and a second circuit electrode 32 formed on the main side 31a of the second circuit board 31. An insulating layer (not shown) may also be formed on the main side 31a of the circuit board 31.

The first circuit member 20 and second circuit member 30 are not particularly restricted so long as they contain the electrodes which require electrical connection. Specifically, there may be mentioned glass or plastic boards, printed circuit boards, ceramic circuit boards, flexible circuit boards, semiconductor silicon chips and the like on which ITO is formed for use in liquid crystal display devices, and they may also be used in combination as necessary. Thus, for this embodiment there may be used a printed circuit board or a circuit member having any of various surface conditions, including organic materials such as polyimides, and metals such as copper or aluminum, or inorganic substances such as ITO (indium tin oxide), silicon nitride ($SiN_x$) or silicon dioxide ($SiO_2$).

The circuit connecting member 10 comprises an insulating substance 11 and conductive particles 7. The conductive particles 7 are situated not only between the opposing first circuit electrode 22 and second circuit electrode 32, but also between the main sides 21a and 31a. In the connection structure 1 for a circuit member of this embodiment, the first circuit electrode 22 and second circuit electrode 32 are electrically connected via the conductive particles 7. Thus, connection resistance between the first circuit electrode 22 and the second circuit electrode 32 is sufficiently reduced. Consequently, smooth current flow can be achieved between the first circuit electrode 22 and second circuit electrode 32, to allow the function of the circuit to be adequately exhibited. Adding the conductive particles 7 in the proportion mentioned above can create electrical connection anisotropy.

When the circuit connecting member 10 lacks the conductive particles 7, electrical connection is accomplished by direct contact or sufficient proximity between the first circuit electrode 22 and second circuit electrode 32 for the desired volume of current to flow.

Since the circuit connecting member 10 is composed of a cured circuit connecting material containing the adhesive composition, the adhesive strength of the circuit connecting member 10 for the first circuit member 20 or second circuit member 30 is satisfactorily high, and the condition can be maintained for prolonged periods. Consequently, long-term reliability of electrical properties can be increased between the first circuit electrode 22 and second circuit electrode 32.

(Semiconductor Device)

Figure 2:
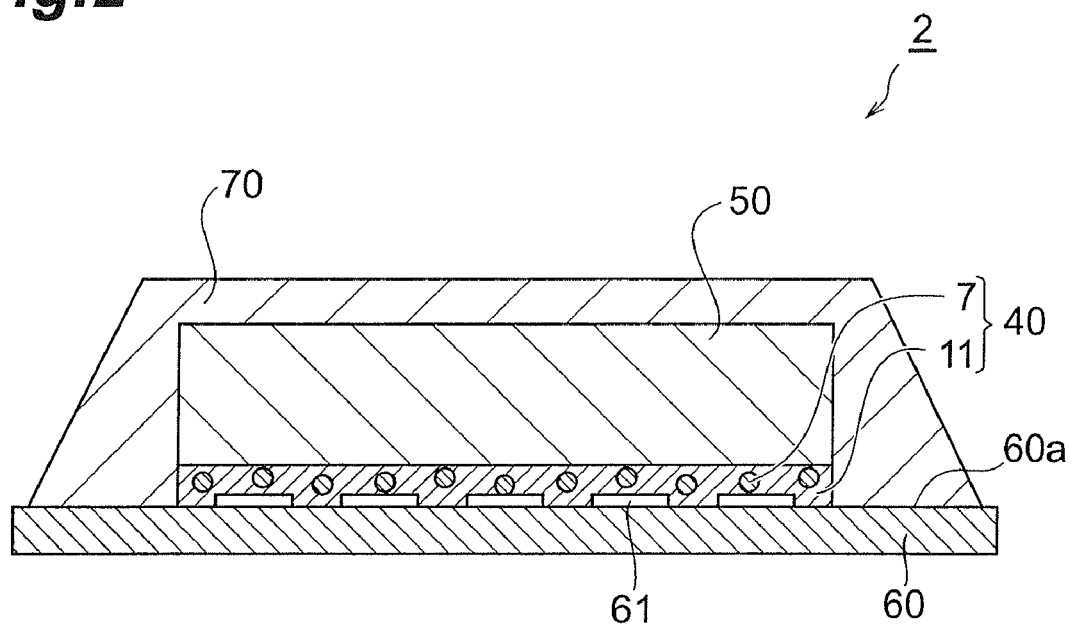
FIG. 2 is a simplified cross-sectional view showing an embodiment of a semiconductor device according to the invention.

An embodiment of a semiconductor device according to the invention will now be explained. FIG. 2 is a simplified cross-sectional view showing an embodiment of a semiconductor device according to the invention. As shown in FIG. 2, the semiconductor device 2 of this embodiment comprises a semiconductor element 50 and a base 60 serving as the support member for the semiconductor, and a semiconductor element connecting member 40 is provided between the semiconductor element 50 and the base 60 for electrical connection between them. The semiconductor element connecting member 40 is laminated on the main side 60a of the base 60, while the semiconductor element 50 is further laminated on the semiconductor element connecting member 40.

The base 60 is provided with a circuit pattern 61, and the circuit pattern 61 is electrically connected via the semiconductor connecting member 40 on the main side 60a of the base 60, or directly with the semiconductor element 50. These are sealed with a sealing material 70 to form the semiconductor device 2.

The material for the semiconductor element 50 is not particularly restricted, and there may be used various types including Group 4 semiconductor elements such as silicon or germanium, Group III-V compound semiconductor elements such as GaAs, InP, GaP, InGaAs, InGaAsP, AlGaAs, InAs, GaInP, AlInP, AlGaInP, GaNAs, GaNP, GaInNAs, GaInNP, GaSb, InSb, GaN, AlN, InGaN or InNAsP, Group II-VI compound semiconductor elements such as HgTe, HgCdTe, CdMnTe, CdS, CdSe, MgSe, MgS, ZnSe or ZeTe, and CuInSe (CIS).

The semiconductor element connecting member 40 includes an insulating substance 11 and conductive particles 7. The conductive particles 7 are situated not only between the semiconductor element 50 and circuit pattern 61, but also between the semiconductor element 50 and the main side 60a. In the semiconductor device 2 of this embodiment, the semiconductor element 50 and circuit pattern 61 are electrically connected via the conductive particles 7. Connection resistance between the semiconductor element 50 and circuit pattern 61 is therefore adequately reduced. Consequently, smooth current flow can be achieved between the semiconductor element 50 and circuit pattern 61, to allow the function of the semiconductor to be adequately exhibited. In addition, adding the conductive particles 7 in the proportion mentioned above can create electrical connection anisotropy.

When the semiconductor element connecting member 40 lacks the conductive particles 7, electrical connection is accomplished by direct contact or sufficient proximity between the semiconductor element 50 and circuit pattern 61 for the desired volume of current to flow.

Since the semiconductor element connecting member 40 is composed of the cured adhesive composition containing the adhesive composition, the adhesive strength, of the semiconductor element connecting member 40 for the semiconductor element 50 and base 60 is satisfactorily high, and the condition can be maintained for prolonged periods. Consequently, long-term reliability of electrical properties can be increased between the semiconductor element 50 and base 60.

EXAMPLES

The present invention will now be explained in detail by examples, with the understanding that the invention is not limited to the examples.

(Preparation of Conductive Particles)

A nickel layer was formed on the surface of polystyrene particles to a thickness of 0.2 μm, and then a metal layer was formed on the outside of the nickel layer to a thickness of 0.02 μm to produce conductive particles with a mean particle size of 4 μm and a specific gravity of 2.5.

Example 1

There was dissolved 50 parts by weight of a phenoxy resin (thermoplastic resin, average molecular weight: 45,000, trade name PKHC by Union Carbide) in 75 parts by weight of methyl ethyl ketone to obtain a solution with a solid portion of 40 wt %.

To this solution there were added 25 parts by weight of isocyanuric acid EO-modified diacrylate (radical polymerizing compound, trade name: M-215 by Toagosei Co., Ltd.), 20 parts by weight of urethane acrylate (trade name: AT-600 by Kyoeisha Chemical Co., Ltd.), 5 parts by weight of 2-(meth)acryloyloxyethyl phosphate (trade name: Light Ester P-2M by Kyoeisha Chemical Co., Ltd.), 3 parts by weight of t-hexylperoxy-2-ethyl hexanoate (radical polymerization initiator, one-minute half-life temperature: 132.6° C., trade name: PERHEXYL O by NOF Corp.) and 1.0 part by weight of bis(1,2,2,6,6-pentamethyl-4-piperidyl)sebacate (radical polymerization regulator, see formula (9)). To the obtained mixture there were added and dispersed 1.5 vol % of conductive particles to obtain an adhesive composition (a).

A publicly known coating apparatus was then used to coat the obtained adhesive composition (a) onto an 80 μm-thick fluorine resin film that had been surface treated on one side, and the coating was hot-air dried at 70° C. for 10 minutes to obtain a circuit connecting material film (A) with a layer thickness of 15 μm.

Example 2

A circuit connecting material film (B) was obtained in the same manner as Example 1, except that 1 part by weight of bis(2,2,6,6-tetramethyl-4-piperidyl)sebacate was added instead of bis(1,2,2,6,6-pentamethyl-4-piperidyl)sebacate as the radical polymerization regulator.

Example 3

A circuit connecting material film (C) was obtained in the same manner as Example 1, except that 3 parts by weight of diisopropyl peroxycarbonate (radical polymerization initiator, one-minute half-life temperature: 88.3° C., trade name: PEROYL IPP by NOF Corp.) was added instead of t-hexylperoxy-2-ethyl hexanoate as the radical polymerization initiator.

Comparative Example 1

A circuit connecting material film (D) was obtained in the same manner as Example 1, except that bis(1,2,2,6,6-pentamethyl-4-piperidyl) sebacate was not used as a radical polymerization regulator.

Example 4

There was dissolved 40 parts by weight of a phenoxy resin (thermoplastic resin, average molecular weight: 45,000, trade name: PKHC by Union Carbide) in 60 parts by weight of methyl ethyl ketone to obtain a solution with a solid portion of 40 wt %.

Separately, 450 parts by weight of polybutylene adipate diol (average molecular weight: 2000), 450 parts by weight of polyoxytetramethylene glycol (average molecular weight: 2000) and 100 parts by weight of 1,4-butyleneglycol were uniformly mixed in 4000 parts by weight of methyl ethyl ketone, and then 390 parts by weight of diphenylmethane diisocyanate was further added prior to reaction at 70° C., to obtain a urethane resin (weight-average molecular weight: 350,000).

Also, 35 parts by weight of the aforementioned solution was mixed with 15 parts by weight of the urethane resin to obtain a mixture.

To this solution there were added 15 parts by weight of isocyanuric acid EO-modified diacrylate (radical polymerizing compound, trade name: M-215 by Toagosei Co., Ltd.), 30 parts by weight of urethane acrylate (radical polymerizing compound, trade name: AT-600 by Kyoeisha Chemical Co., Ltd.), 5 parts by weight of 2-(meth)acryloyloxyethyl phosphate (radical polymerizing compound, trade name: Light Ester P-2M by Kyoeisha Chemical Co., Ltd.), 3 parts by weight of t-hexylperoxy-2-ethyl hexanoate (radical polymerization initiator, one-minute half-life temperature: 132.6° C., trade name: PERHEXYL O by NOF Corp.) and 0.5 part by weight of 2,2,6,6-tetramethylpiperidine-1-oxyl (radical polymerization regulator). To the obtained mixture there were added and dispersed 1.5 vol % of conductive particles to obtain adhesive composition (b).

A publicly known coating apparatus was then used to coat the obtained adhesive composition (b) onto an 80 μm-thick fluorine resin film that had been surface treated on one side, and the coating was hot-air dried at 70° C. for 10 minutes to obtain a circuit connecting material film (E) with a layer thickness of 15 μm.

Example 5

A circuit connecting material film (F) was obtained in the same manner as Example 3, except that 0.5 part by weight of 4-hydroxy-2,2,6,6-tetramethylpiperidine-1-oxyl was added instead of 2,2,6,6-tetramethylpiperidine-1-oxyl as the radical polymerization regulator.

Comparative Example 2

A circuit connecting material film (G) was obtained in the same manner as Example 3, except that 2,2,6,6-tetramethylpiperidine-1-oxyl was not used as a radical polymerization regulator.

(Evaluation Method)
[Measurement of Adhesive Strength]

The adhesive strengths of the circuit connecting material films (A)-(D) obtained by the methods described above were measured by the 90° peel method according to JIS-Z0237, and the variation in adhesive strength at heating temperatures of 150° C., 160° C. and 170° C. was evaluated. The adhesive strength measuring apparatus used was a TENSILON UTM-4 (peel rate: 50 mm/min, 25° C., product of Toyo Baldwin Co., Ltd.). The results are shown in Table 1.

The adhesive strengths of the circuit connecting material films (E)-(G) were measured in the same manner, except that the evaluation was conducted at heating temperatures of 140° C., 160° C. and 200° C. The results are shown in Table 2.

[Measurement of Connection Resistance]

The circuit connecting material films (A)-(D) obtained by the methods described above were used for electrical connection between a flexible circuit board (FPC) having 500 copper circuit wires at a line width of 25 µm, a pitch of 50 µm and a thickness of 18 µm, and a glass panel (1.1 mm thickness, 20Ω/☐ surface resistance) having a 0.2 µm indium tin oxide (ITO) thin-layer formed thereon, over a width of 2 mm using a thermocompression bonding apparatus (heating system: constant heating, product of Toray Engineering). The heating and pressing conditions were heating temperatures of 150° C., 160° C. and 170° C., a pressure of 3 MPa and a heating/pressing time of 15 seconds. The connection resistance between the electrically connected circuits was measured using a multimeter immediately after bonding and after holding for 120 hours in a high-temperature, high-humidity vessel at 85° C., 85% RH. The resistance value was expressed as the average of 150 resistance points between the adjacent circuits (x+3σ). The results are shown in Table 1.

The circuit connecting material films (E)-(G) obtained by the methods described above were used for electrical connection between a flexible circuit board (FPC) having 500 copper circuit wires at a line width of 25 µm, a pitch of 50 µm and a thickness of 18 µm, and a glass panel (1.1 mm thickness, 20Ω/☐ surface resistance) having a 0.2 µm indium tin oxide (ITO) thin-layer formed thereon, over a width of 2 mm using a thermocompression bonding apparatus (heating system: constant heating, product of Toray Engineering). The heating and pressing conditions were heating temperatures of 140° C., 160° C. and 200° C., a pressure of 3 MPa and a heating/pressing time of 10 seconds. The connection resistance between the electrically connected circuits was measured using a multimeter immediately after bonding and after holding for 168 hours in a high-temperature, high-humidity vessel at 85° C., 85% RH. The resistance value was expressed as the average of 37 resistance points between the adjacent circuits (x+3σ). The results are shown in Table 2.

TABLE 1

| | Heating temperature | Adhesive strength (N/m) | | Connection resistance (Ω) | |
|---|---|---|---|---|---|
| | | Immediately after bonding | After 120 h. | Immediately after bonding | After 120 h. |
| Example 1 | 150° C. | 1080 | 930 | 1.8 | 2.5 |
| | 160° C. | 1100 | 955 | 1.6 | 2.5 |
| | 170° C. | 1120 | 960 | 1.7 | 2.8 |
| Example 2 | 150° C. | 1100 | 1040 | 2.0 | 2.4 |
| | 160° C. | 1030 | 980 | 1.8 | 2.7 |
| | 170° C. | 1060 | 980 | 2.1 | 2.6 |
| Example 3 | 150° C. | 800 | 360 | 2.8 | ≧10 |
| | 160° C. | 680 | 420 | 8.4 | ≧10 |
| | 170° C. | 535 | 350 | ≧10 | ≧10 |
| Comp. Ex. 1 | 150° C. | 1170 | 700 | 2.4 | 2.8 |
| | 160° C. | 815 | 620 | 3.8 | 3.8 |
| | 170° C. | 540 | 325 | ≧10 | ≧10 |

TABLE 2

| | Heating temperature | Adhesive strength (N/m) | | Connection resistance (Ω) | |
|---|---|---|---|---|---|
| | | Immediately after bonding | After 168 h. | Immediately after bonding | After 168 h. |
| Example 4 | 140° C. | 670 | 600 | 1.6 | 2.8 |
| | 160° C. | 700 | 650 | 1.7 | 2.9 |
| | 200° C. | 780 | 700 | 1.9 | 3.2 |
| Example 5 | 140° C. | 685 | 630 | 1.4 | 2.6 |
| | 160° C. | 720 | 700 | 1.8 | 2.5 |
| | 200° C. | 800 | 720 | 2.3 | 3.6 |
| Comp. Ex. 2 | 140° C. | 530 | 380 | 3.9 | 7.0 |
| | 160° C. | 600 | 470 | 3.2 | 6.8 |
| | 200° C. | 700 | 500 | 12.5 | 23.4 |

The circuit connecting material films (A)-(C) of Examples 1 to 3 exhibited low variation in adhesive strength, with heating temperatures of 150-170° C., immediately after bonding and after holding for 120 hours in a high-temperature, high-humidity vessel at 85° C., 85% RH, demonstrating that they have satisfactory properties for a wide range of heating temperatures. In contrast, the circuit connecting material film (D) of Comparative Example 1 which was not according to the invention exhibited a relatively significant reduction in adhesive strength with higher heating temperature.

Also, the circuit connecting material films (A) and (B) of Examples 1 and 2, which employed radical polymerization initiators having one-minute half-life temperatures of 90-175° C., exhibited low variation in connection resistance, with heating temperatures of 150-170° C., immediately after bonding and after holding for 120 hours in a high-temperature, high-humidity vessel at 85° C., 85% RH, demonstrating that they are more preferred modes.

Also, the circuit connecting material films (E) and (F) of Examples 4 and 5 exhibited low variation in adhesive strength, with heating temperatures of 140-200° C., immediately after bonding and after holding for 168 hours in a high-temperature, high-humidity vessel at 85° C., 85% RH, demonstrating that they have satisfactory properties for a wide range of heating temperatures. However in Comparative Example 3, which did not employ a radical polymerization regulator of the invention, the connection resistance value immediately after bonding was high at all temperatures, while a drastic increase in connection resistance was seen with heating at 200° C., and after holding for 168 hours in a high-temperature, high-humidity vessel at 85° C., 85% RH the increase in connection resistance was greater than in Examples 4 and 5. The adhesive strength was also reduced compared to Examples 4 and 5.

When Examples 4 and 5 are compared with Comparative Example 2 in terms of the connection resistance ratio (maximum connection resistance/minimum connection resistance) immediately after bonding, the ratio was 1.2 (1.9 (connection resistance at 200° C.)/1.6 (connection resistance at 140° C.)) in Example 4 and 1.6 (2.3 (connection resistance at 200° C.)/1.4 (resistance value at 140° C.)) in Example 5, while the ratio was 3.9 (12.5 (resistance value at 200° C.)/3.2 (resistance value at 160° C.)) in Comparative Example 2.

This demonstrated that using a radical polymerization regulator according to the invention can ensure a wide curing temperature margin and high reliability.

(Shelf Stability)

The circuit connecting material films (A) and (E) obtained in Examples 1 and 4 were stored in a vacuum package and allowed to stand at 40° C. for 3 days, after which FPC and ITO were thermally bonded under conditions of 160° C., 3 MPa, 10 sec using the aforementioned thermocompression bonding apparatus. The adhesive strengths and connection resistances of the obtained films were measured according to evaluation methods 1 and 2. The results are shown in Table 3.

TABLE 3

| | Adhesive strength (N/m) | | Connection resistance (Ω) | |
|---|---|---|---|---|
| | Before standing | After standing 40° C., 3 days | Before standing | After standing 40° C., 3 days |
| Example 1 | 1.8 | 1.8 | 1080 | 1030 |
| Example 4 | 1.6 | 1.8 | 670 | 720 |

Table 3 shows that the circuit connecting material films (A) and (E) of Examples 1 and 4 exhibited satisfactory adhesive strength and connection resistance before and after standing at 40° C., and therefore have excellent stability with passage of time.

INDUSTRIAL APPLICABILITY

As explained above, according to the present invention it is possible to provide an adhesive composition, a circuit connecting material, a connection structure for a circuit member and a semiconductor device whereby curing treatment can be carried out with sufficient speed at low temperature, curing treatment can be carried out with a wide process margin, and adequately stable adhesive strength can be obtained.

What is claimed is:

1. A circuit-connecting material for electrical connection between opposing circuit electrodes,
wherein the circuit connecting material comprises an adhesive composition comprising a thermoplastic resin, a radical polymerizing compound, a peroxy ester derivative with a one-minute half-life temperature of 90-175° C., and an amine compound represented by the following general formula (1):

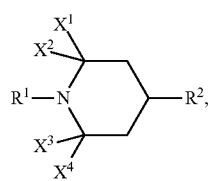

(1)

wherein $R^1$ and $R^2$ each independently represent hydrogen, hydroxyl, or a monovalent organic group, and $X^1$, $X^2$, $X^3$, and $X^4$ each independently represent hydrogen or C1-C5 alkyl.

2. The circuit-connecting material according to claim 1, wherein R' is hydrogen, hydroxyl, C1-C10 alkyl, aryl, C2-C20 alkoxy or a monovalent organic group represented by the following general formula (2):

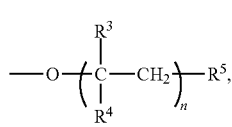

(2)

wherein $R^3$ represents hydrogen or C1-C5 alkyl, $R^4$ represents C1-C5 ester, benzyl ester, carboxyl or aryl, $R^5$ represents hydrogen, C1-C20 alkyl, C1-C20 alkoxy, phenoxy, aryl, C1-C20 carbonyloxy, phenylcarbonyloxy or vinyl and n represents an integer of 1-20, where phenoxy, aryl and phenylcarbonyloxy may be optionally substituted with C1-C5 alkyl.

3. The circuit-connecting material according to claim 1, wherein the amine compound contains N,N'-bis(3-aminopropyl)ethylenediamine and 2,4-bis[N-butyl-N-(1,2,2,6,6-pentamethyl-4-piperidyl)amino]-6-chloro-1,3,5-triazine condensate, and poly[{6-(1,1,3,3-tetramethylbutyl)amino-1,3,5-triazine-2,4-diyl}{2,2,6,6-tetramethyl-4-piperidyl)imino}hexamethylene{(2,2,6,6-tetramethyl-4-piperidyl)imino}], a compound represented by the following chemical formula (3):

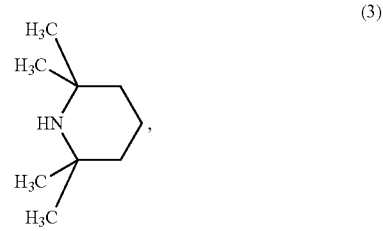

(3)

a compound represented by the following chemical formula (4):

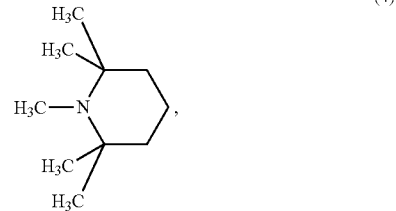

(4)

a compound represented by the following chemical formula (5):

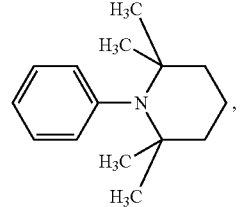

(5)

a compound represented by the following chemical formula (6):

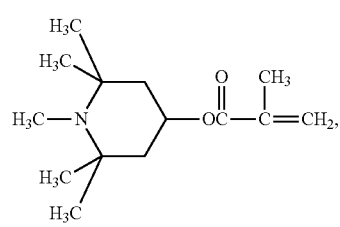

(6)

a compound represented by the following chemical formula (7):

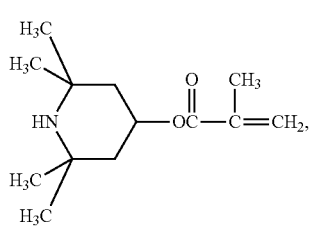
(7)

a compound represented by the following chemical formula (8):

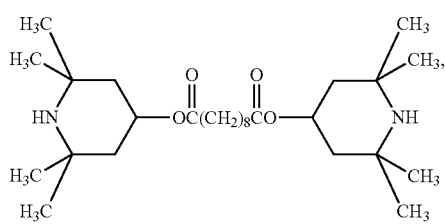
(8)

a compound represented by the following chemical formula (9):

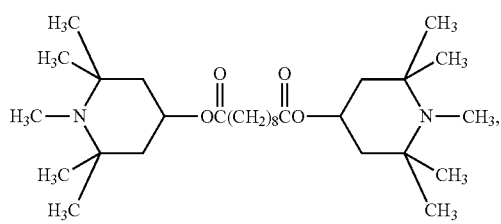
(9)

a compound represented by the following chemical formula (10):

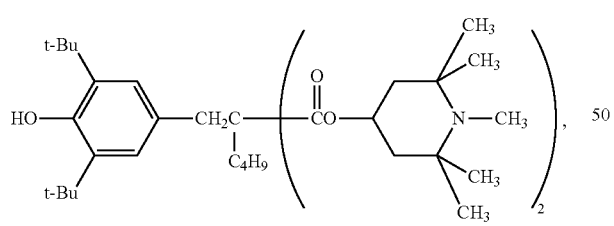
(10)

a compound represented by the following chemical formula (11):

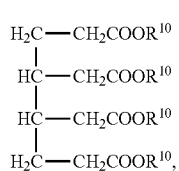
(11)

wherein $R^{10}$ is a group represented by formula (12a) or (12b) below:

(12a)

(12b)

a compound represented by the following chemical formula (13):

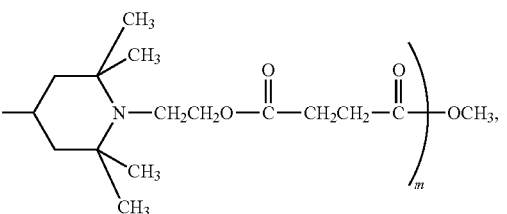
(13)

wherein m represents a positive integer, a compound represented by the following chemical formula (14):

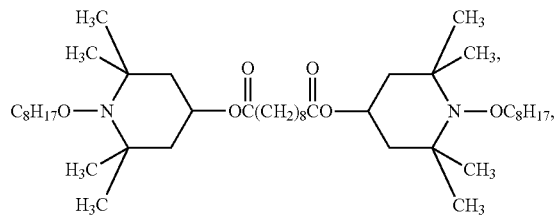
(14)

a compound represented by the following chemical formula (15):

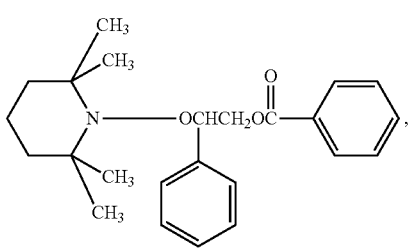
(15)

a compound represented by the following chemical formula (16):

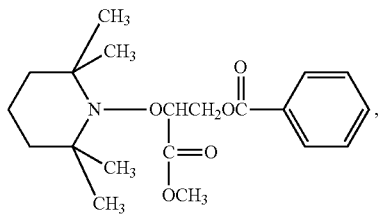

(16)

and
a polymer obtained by introducing a substituent represented by the general formula (1) above at a side chain.

4. The circuit-connecting material according to claim 1, wherein the radical polymerizing compound has at least two (meth)acryloyl groups in the molecule.

5. The circuit-connecting material according to claim 1, wherein the peroxy ester derivative has a molecular weight of 180-1,000.

6. The circuit-connecting material according to claim 1, which contains the radical polymerizing compound at 50-250 parts by weight, the peroxy ester derivative at 0.05-30 parts by weight and the amine compound at 0.001-30 parts by weight with respect to 100 parts by weight of the thermoplastic resin.

7. The circuit-connecting material according to claim 1, characterized by further comprising conductive particles.

8. The circuit-connecting material according to claim 7, which comprises the conductive particles at 0.5-30 parts by weight with respect to 100 parts by weight of the thermoplastic resin.

9. A circuit-connecting material film obtained by forming the circuit-connecting material according to claim 1 into a film shape.

10. A connecting structure for a circuit member, comprising:
a first circuit member having a first circuit electrode formed on a main side of a first circuit board,
a second circuit member having a second circuit electrode formed on a main side of a second circuit board, and
a circuit connecting member formed between the main side of the first circuit board and the main side of the second circuit board, which electrically connects the first circuit electrode and the second circuit electrode which are positioned opposite each other,
characterized in that the circuit connecting member is a cured product of the circuit-connecting material according to claim 1.

* * * * *